(12) United States Patent
Huang et al.

(10) Patent No.: US 11,137,249 B2
(45) Date of Patent: Oct. 5, 2021

(54) HIGH QUALITY FACTOR MEMS SILICON HINGE AND SLOT-CUT RESONATOR FOR A VIBRATORY GYROSCOPE

(71) Applicant: HRL Laboratories, LLC, Malibu, CA (US)

(72) Inventors: Lian X. Huang, Thousand Oaks, CA (US); Logan D. Sorenson, Thousand Oaks, CA (US); Chia-Ming "Gavin" Chang, Agoura Hills, CA (US); Raviv Perahia, Calabasas, CA (US); Hung Nguyen, Los Angeles, CA (US); David T. Chang, Calabasas, CA (US)

(73) Assignee: HRL Laboratories, LLC, Malibu, CA (US)

( * ) Notice: Subject to any disclaimer, the term of this patent is extended or adjusted under 35 U.S.C. 154(b) by 442 days.

(21) Appl. No.: 16/102,565

(22) Filed: Aug. 13, 2018

(65) Prior Publication Data

US 2019/0072388 A1    Mar. 7, 2019

Related U.S. Application Data

(60) Provisional application No. 62/555,617, filed on Sep. 7, 2017.

(51) Int. Cl.
*G01C 19/5677* (2012.01)
*G01C 19/5684* (2012.01)

(52) U.S. Cl.
CPC ..... *G01C 19/5684* (2013.01); *G01C 19/5677* (2013.01); *B81B 2201/0242* (2013.01)

(58) Field of Classification Search
CPC .................. G01C 19/5677; G01C 19/5684
See application file for complete search history.

(56) References Cited

U.S. PATENT DOCUMENTS

| 6,367,786 | B1 | 4/2002 | Gutierrez |
| 7,581,443 | B2 | 9/2009 | Kubena |
| 10,794,700 | B1 * | 10/2020 | Shcheglov ............. G01C 25/00 |
| 2004/0041643 | A1 | 3/2004 | Giousouf |
| 2005/0172714 | A1 | 8/2005 | Challoner |
| 2007/0017287 | A1 | 1/2007 | Kubena |

FOREIGN PATENT DOCUMENTS

EP    2111531 B1    11/2012

OTHER PUBLICATIONS

Serrano, Diego Emilio, "Design and Analysis of MEMS Gyroscopes," IEEE Sensors 2013, Qualtré—Georgia Institute of Technology, Tutorials: Nov. 3, 2013, Conference: Nov. 4-6, 2013 (39 pages).

PCT International Search Report and Written Opinion from PCT/US2018/046559 dated Dec. 5, 2018.

(Continued)

*Primary Examiner* — Herbert K Roberts
(74) *Attorney, Agent, or Firm* — Ladas & Parry

(57) ABSTRACT

A resonant structure comprising at least two coaxial rings, wherein adjacent coaxial rings have adjacent peripheries and are attached together by a plurality of connection structures regularly arranged along said adjacent peripheries; and wherein a first ring has a first ring portion with a first radial thickness and a second ring, portion, in a vicinity of a first connection structure, with a second radial thickness smaller than said first radial thickness.

18 Claims, 9 Drawing Sheets

(56) References Cited

OTHER PUBLICATIONS

Extended European search report from European Application No. 18854502.4 dated April 9. 2021.
Zhou, Xin et al.: "The mechanical sensitivity optimization of a disk resonator gyroscope with mutative ring thickness", 2016 IEEE International Symposium on Inertial Sensors and Systems, IEEE, Feb. 22, 2016 (Feb. 22, 2016), pp. 54-57, XP032883684, DOI: 10.1109/ISISS.2016.7435543 [retrieved on Mar. 17, 2016].

* cited by examiner

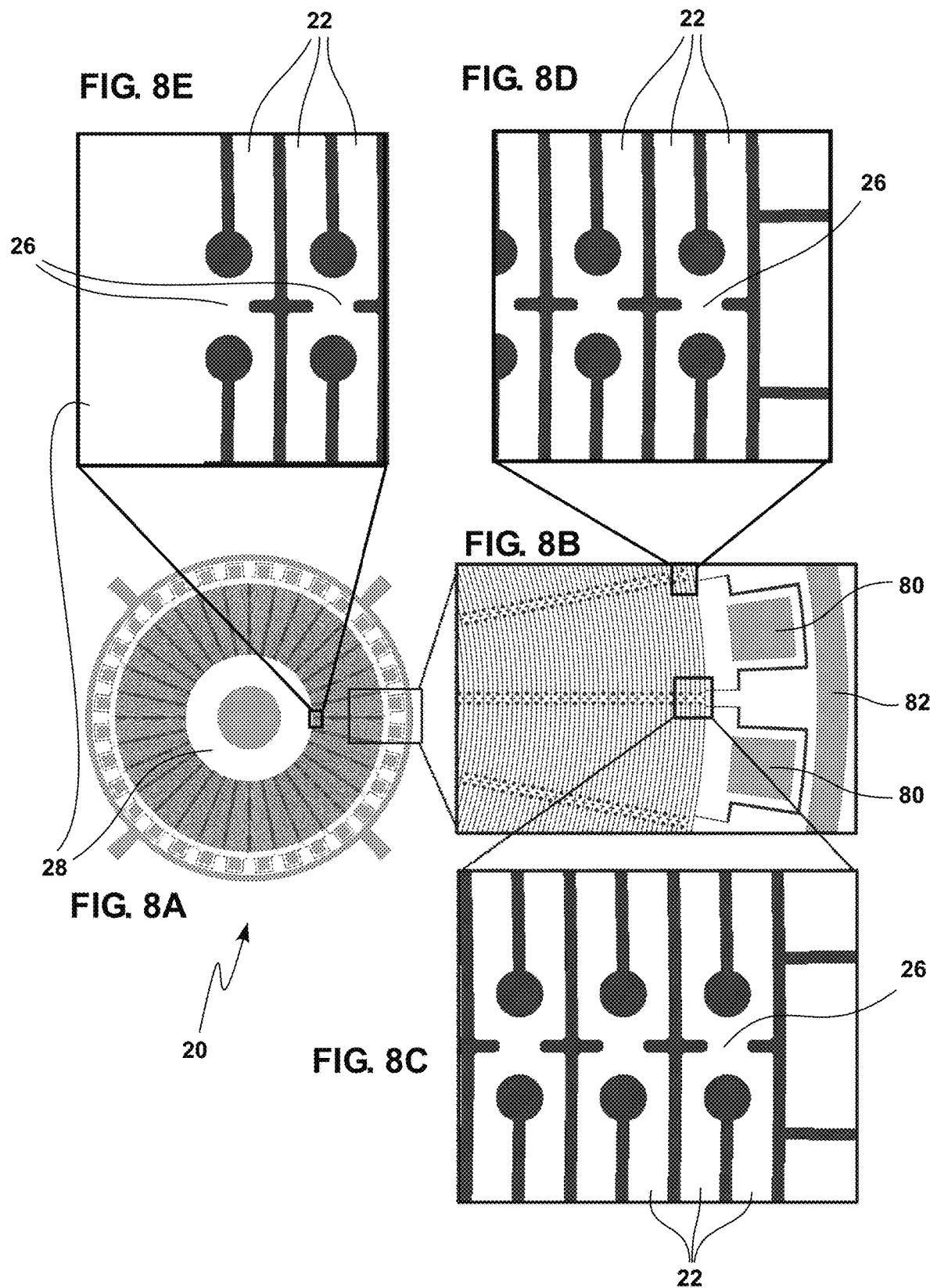

US 11,137,249 B2

HIGH QUALITY FACTOR MEMS SILICON HINGE AND SLOT-CUT RESONATOR FOR A VIBRATORY GYROSCOPE

CROSS-REFERENCE TO RELATED APPLICATIONS

This presentation claims priority to U.S. provisional application No. 62/555,617 filed Sep. 7, 2017, which is hereby incorporated by reference.

TECHNICAL FIELD

This presentation relates to MEMS Disk Resonator Gyroscopes, and in particular relates to the disk resonators of Coriolis Vibratory Gyroscopes.

BACKGROUND

Disc Resonator Gyroscopes are described for example in U.S. Pat. No. 7,581,443. FIG. 1 illustrates a perspective view and a detailed fragment of a perspective view of a portion of a known disc resonator 10 architecture for an all-quartz or all silicon resonator gyroscope. Resonator 10 can be fabricated out of a fused quartz or silicon plane disc in which deep reactive ion etching may be used to slot the disc into a system of adjacent coaxial rings 12 supported at a central support 14; adjacent coaxial rings 12 having adjacent peripheries 13 and being attached together by a plurality of connection structures 16 regularly arranged along said adjacent peripheries.

A problem of known resonator 10 is that vibratory Gyroscopes using such resonators are sensitive to vibration, shock, and temperature. With known vibratory gyroscope designs, especially disk resonator gyroscopes having a resonator such as 10 with a plurality of interconnected concentric rings 12, reducing ring 12 width reduces the resonator's stiffness dramatically, resulting in lower resonance frequency, thus improving the tuning capability of the resonator (which allows for example to accommodate a temperature induced drift) but also at the same time making the resonator more susceptible to environmental vibrations and/or shocks.

There exists a need for a design of a resonator for a disk resonator gyroscope having improved tuning capability as well as low sensitivity to vibration and shock.

There exists a need for a disk resonator gyroscope capable of operating at similar frequencies as known resonators while having higher quality factors.

SUMMARY

This presentation relates to resonators or resonant structures, such as for a disk resonator gyroscope, having concentric rings attached to each other by "Hinge and/or Slot" connection structures wherein the width of the rings is reduced in the vicinity of the connection structures, such design making the resonators less sensitive to vibration and shock compared to known resonators having rings of same width but no "Hinge and/or Slot" connection structures.

The present disclosure improves MEMS gyroscope having concentric rings attached together by joints, or connection structures, by making the joints between the rings as compliant as the remaining portions of the rings, without reducing the resonance frequency of the resonator.

An embodiment of this presentation comprises a resonant structure consisting of a rotationally-symmetric array of hinged joint designs connecting concentric rings.

According to an embodiment of this presentation, the hinged joint comprises two circular cuts with radius greater than inter-ring gap width, and optionally two slot cuts on the two sides of the joint (inner and outer sides of the joint), as illustrated for example in FIGS. 2, 3.

According to an embodiment of this presentation, the hinged joint comprises an ellipse or circle cut at the center of the joint; as illustrated for example in FIG. 7a.

According to an embodiment of this presentation, the hinged joint comprises two slot cuts at the two side of the joint (inner and outer sides of the joint); as illustrated for example in FIG. 7b.

According to an embodiment of this presentation, the hinged joint has one slot cut starting from one edge of the joint, and all the slot-cuts are facing the same direction; as illustrated for example in FIGS. 7c, d.

According to an embodiment of this presentation, slot cuts of the hinged joint of two consecutive pairs of rings are facing opposite radial directions; as illustrated for example in FIG. 7e.

According to an embodiment of this presentation, the hinged joint comprises a teardrop shaped cut out; as illustrated for example in FIGS. 7f, 7g and 7h.

According to an embodiment of this presentation, the teardrop shape is formed by a smooth curve with continuous radius of curvature.

According to an embodiment of this presentation, the teardrop shape comprises a large lobe near the hinged joint between rings and a narrower width away from the hinged joint such that the ring width equals a desired design value away from the joint.

According to an embodiment of this presentation, the hinged joint region comprises a rounded or smoothed slot cut defined by a smooth curve; as illustrated for example in FIG. 7g.

According to an embodiment of this presentation, the hinged joint region has an extended rounded or smooth slot cut which transitions to a region of constant width; as illustrated for example in FIG. 7h.

According to an embodiment of this presentation, the resonant structure is surrounded by peripheral electrodes; as illustrated for example in FIG. 8.

According to an embodiment of this presentation, the resonant structure is fabricated on SOI wafers; as illustrated for example in FIGS. 6A to 6D.

An embodiment of this presentation relates to a MEMS disc resonator having top and bottom main surfaces; the resonator having a central support and including a first plurality of circumferential slots regularly arranged around the central support between the top and bottom main surfaces; each circumferential slot of the first plurality having: an inner vertical circumferential wall that follows an arc of a circle having a first radius centered on an axis of the central support; an outer vertical circumferential wall that follows an arc of a circle having a second radius centered on the axis of the central support, the second radius being larger than the first radius; a first vertical cylindrical side wall that extends between a first end of the inner vertical circumferential wall and a first end of the outer vertical circumferential wall, along an arc of a circle having a third radius and having a center on a circle having a fourth radius, the third radius being larger than a difference between the second and first radiuses and the fourth radius being equal to half a sum of the second and first radiuses; and a second vertical cylindrical side wall that extends between a second end of the inner vertical circumferential wall and a second end of the outer vertical circumferential wall, along an arc of a circle having the third radius and having a center on the circle having the fourth radius.

According to an embodiment of this presentation, the MEMS disc resonator comprises a second plurality of circumferential slots arranged regularly around the central support between the top and bottom main surfaces; each circumferential slot of the second plurality having: an inner vertical circumferential wall that follows an arc of a circle having a fifth radius centered on the axis of the central support; the fifth radius being larger than a sum of the third and fourth radiuses; an outer vertical circumferential wall that follows an arc of a circle having a sixth radius centered on the axis of the central support, the sixth radius being larger than the fifth radius; a first vertical cylindrical side wall that extends between a first end of the inner vertical circumferential wall and a first end of the outer vertical circumferential wall, along an arc of a circle having a seventh radius and having a center on a circle having an eight radius, the seventh radius being larger than a difference between the sixth and fifth radiuses and the eighth radius being equal to half a sum of the sixth and fifth radiuses; and a second vertical cylindrical side wall that extends between a second end of the inner vertical circumferential wall and a second end of the outer vertical circumferential wall, along an arc of a circle having the seventh radius and having a center on the circle having the eighth radius; wherein the centers of the first and second vertical cylindrical side walls of adjacent circumferential slots of the second plurality are arranged symmetrically on each side of a vertical plane that contains the axis of the central support and the center of a circumferential slot of the first plurality of slots.

According to embodiments of this presentation, for each circumferential slot: at least one of the inner vertical circumferential wall and the outer vertical circumferential wall comprises a radial recess symmetrical with respect to a vertical plane that contains the axis of the central support and the center of the circumferential slot.

An embodiment of this presentation relates to a resonant structure comprising at least two coaxial rings, wherein: adjacent coaxial rings have adjacent peripheries and are attached together by a plurality of connection structures regularly arranged along the adjacent peripheries; and a first ring has a first ring portion with a first radial thickness and a second ring portion, in a vicinity of a first connection structure, with a second radial thickness smaller than the first radial thickness.

According to an embodiment of this presentation, the at least two coaxial rings and the plurality of connection structures are formed out of a single plane substrate.

According to an embodiment of this presentation, the second ring portion is angularly offset to a first side of a radial axis of the first connection structure.

According to an embodiment of this presentation, the first ring has a third ring portion, having the second radial thickness, angularly offset to a second side of the radial axis of the first connection structure.

According to an embodiment of this presentation, the resonant structure comprises a second ring concentrically attached to the first ring by the first connection structure; wherein the second ring has a fourth ring portion having a third radial thickness and has fifth and sixth ring portions having each a fourth radial thickness smaller than the third radial thickness; the fifth ring portion being radially aligned with the second ring portion and the sixth ring portion being radially aligned with the third ring portion.

According to an embodiment of this presentation, the peripheries of the first and second rings, in the second, third, fifth and sixth ring portions, follow, along a plane perpendicular to the axis of the rings, portions of a shape selected among: a circle; an ellipse; and a rectangle.

According to an embodiment of this presentation, an angular thickness of the first connection structure varies along a radial axis of the first connection structure.

According to an embodiment of this presentation, the first ring portion is aligned with a radial axis of the first connection structure.

According to an embodiment of this presentation, the second ring portion is formed by a first radial recess developing from a periphery of the first ring distal from the first connection structure toward the first connection structure.

According to an embodiment of this presentation, the periphery of the first ring, in the second ring portion, follow, along a plane perpendicular to the axis of the rings, portions of a shape selected among: a circle; an ellipse; and a rectangle.

According to an embodiment of this presentation, the resonant structure comprises: a second ring concentrically attached to the first ring by the first connection structure; and third and fourth concentric rings attached together by a second connection structure radially aligned with the first connection structure; wherein the third ring has a third ring portion having a third radial thickness and has a fourth ring portion having a fourth radial thickness smaller than the third radial thickness; the fourth ring portion being radially aligned with the second ring portion; the fourth ring portion being formed by a second radial recess developing from a periphery of the third ring distal from the second connection structure toward the second connection structure.

According to an embodiment of this presentation, one of the first and second rings is attached to one of the third and fourth rings by a plurality of regularly arranged connection structures angularly offset from the connection structures attaching the first and second rings.

According to an embodiment of this presentation, a same number N of connection structures attach each ring to a neighboring ring; and connection structures attached to the inner and outer periphery of each ring are angularly offset by $\pi/N$ from each other.

According to an embodiment of this presentation, the first and second radial recesses develop in a same radial direction.

According to an embodiment of this presentation, the first and second radial recesses develop in opposite radial directions.

According to an embodiment of this presentation, the resonant structure comprises a second ring concentrically attached to the first ring by the first connection structure; wherein the second ring has a third ring portion having a third radial thickness and has a fourth ring portion having a fourth radial thickness smaller than the third radial thickness; the fourth ring portion being radially aligned with the second ring portion; the fourth ring, portion being formed by a second radial recess developing from a periphery of the second ring distal from the first connection structure toward the first connection structure.

According to an embodiment of this presentation, the first radial recess develops into the first connection structure.

According to an embodiment of this presentation, the first radial recess develops into a second ring concentrically attached to the first ring by the first connection structure.

According to an embodiment of this presentation, the first reduced radial thickness is formed by a first radial recess developing from a center of the first connection structure toward a periphery of the first ring distal from the first connection structure.

According to an embodiment of this presentation, art angular thickness of the first connection structure varies along a radial axis of the first connection structure.

This presentation also relates to a Gyroscope using any of the resonators described above.

These and other features and advantages will become further apparent from the detailed description and accompanying figures that follow. In the figures and description, numerals indicate the various features; like numerals referring to like features throughout both the drawings and the description.

BRIEF DESCRIPTION OF THE DRAWINGS

FIGS. 8A to E illustrate a top view of a resonator with peripheral electrodes according to embodiments of this presentation, as well as various details of the resonator.

DESCRIPTION

Figure 1:
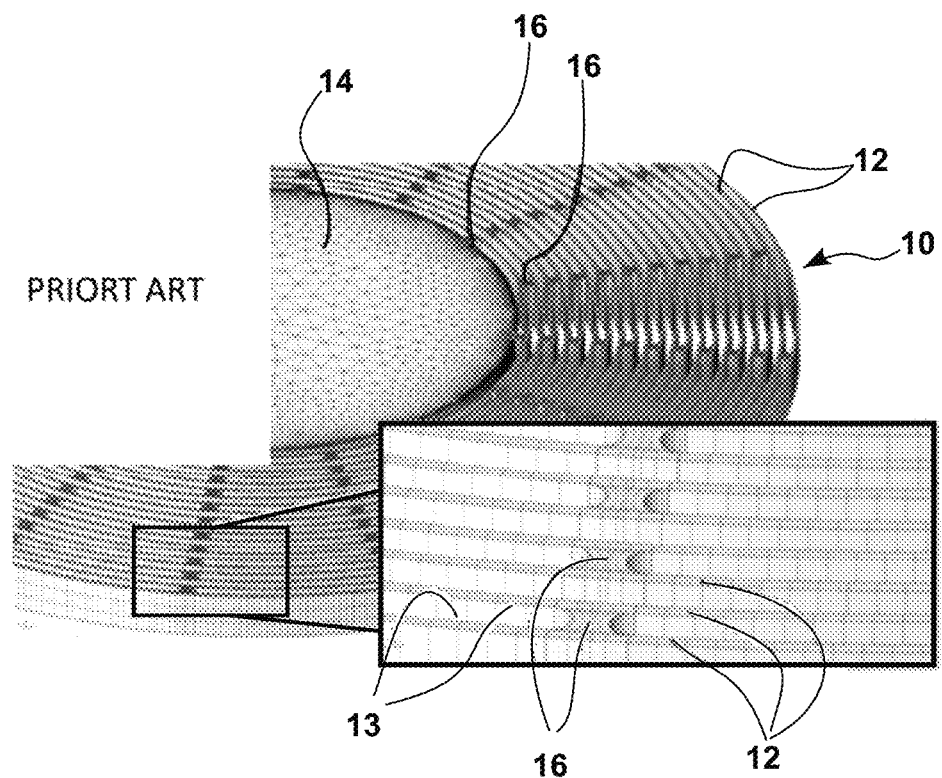
FIG. 1 shows a picture of a fragment of a known Coriolis Vibratory Gyroscope (CVG) resonator, as well as a very detailed view of a fragment of the CVG resonator.

In the following description, numerous specific details are set forth to clearly describe various specific embodiments disclosed herein. One skilled in the art, however, will understand that the presently described invention may be practiced without all of the specific details discussed below. In other instances, well known features have not been described so as not to obscure the invention.

The Inventors have conducted finite element analysis COMSOL models with thermoelastic damping, and have come to the conclusion that the critical location of energy loss of the known Disc Resonator of Disc Resonator Gyroscopes, is at the joint between the rings of the Resonator.

The present disclosure improves MEMS gyroscope having concentric rings attached together by joints, or connection structures, by making the joints between the rings as compliant as the remaining portions of the rings, without reducing the resonance frequency of the resonator. The inventors have found, after performing a deep and exhaustive study of known Disc Resonator and Hinge and Slot-cut Resonators side by side, that Hinge and Slot-cut resonators satisfy the long felt-need for high performance inertial navigation in smaller packages with lower cost, weight, and power.

Embodiments of this presentation provide for a high-Q (Quality Factor) MEMS silicon Hinge and Slot-cut Vibratory Gyroscope/(HSVG). A novel feature is the unique Hinge and Slot-cut vibratory resonator design which allows deformation of its structure without twisting, thus reducing strain-induced thermal gradient and resulting in high thermoelastic damping limited quality factor (QTED>100,000). The Hinge and Slot-cut design according to this presentation enables reducing stiffness of joints/interconnections between rings while maintaining wider ring width (15-20 um), minimizing heat loss regions at the joint to increase thermoelastic damping limited quality factor (QTED).

Maintaining wider ring width allows diminishing surface roughness effect on both quality factor and frequency split between for example two degenerated N=2 modes. Hinge and Slot-cut Vibratory Gyroscopes according to this presentation, with a thickness of 350 um (micrometers) or more, have reduced acceleration sensitivity (up to 50,000 G) in any acceleration direction. Alternatively, by increasing the ring width for the whole structure, the Hinge and Slot-cut Vibratory design can have high adiabatic QTED since wider ring width. (>100 um) will have frequency >100 kHz. Hence, a Hinge and Slot-cut Vibratory design as disclosed, in addition to particular implementations, can be thought of as a method to design high-Q silicon vibratory gyroscope and resonator structures in frequency ranges where this was previously not possible.

Embodiment of this presentation enable designing high-Q MEMS silicon Coriolis Vibratory Gyroscopes (CVGs). Current state-of-art (SOA) CVGs include silicon disk resonator gyroscopes (DRGs) exhibiting resonance frequencies around 14 kHz and Q-factors upward of 80,000. Embodiment of this presentation have a similar resonance frequency but with QTED>1.5× of known, state of the art, DRG.

Figure 2A:
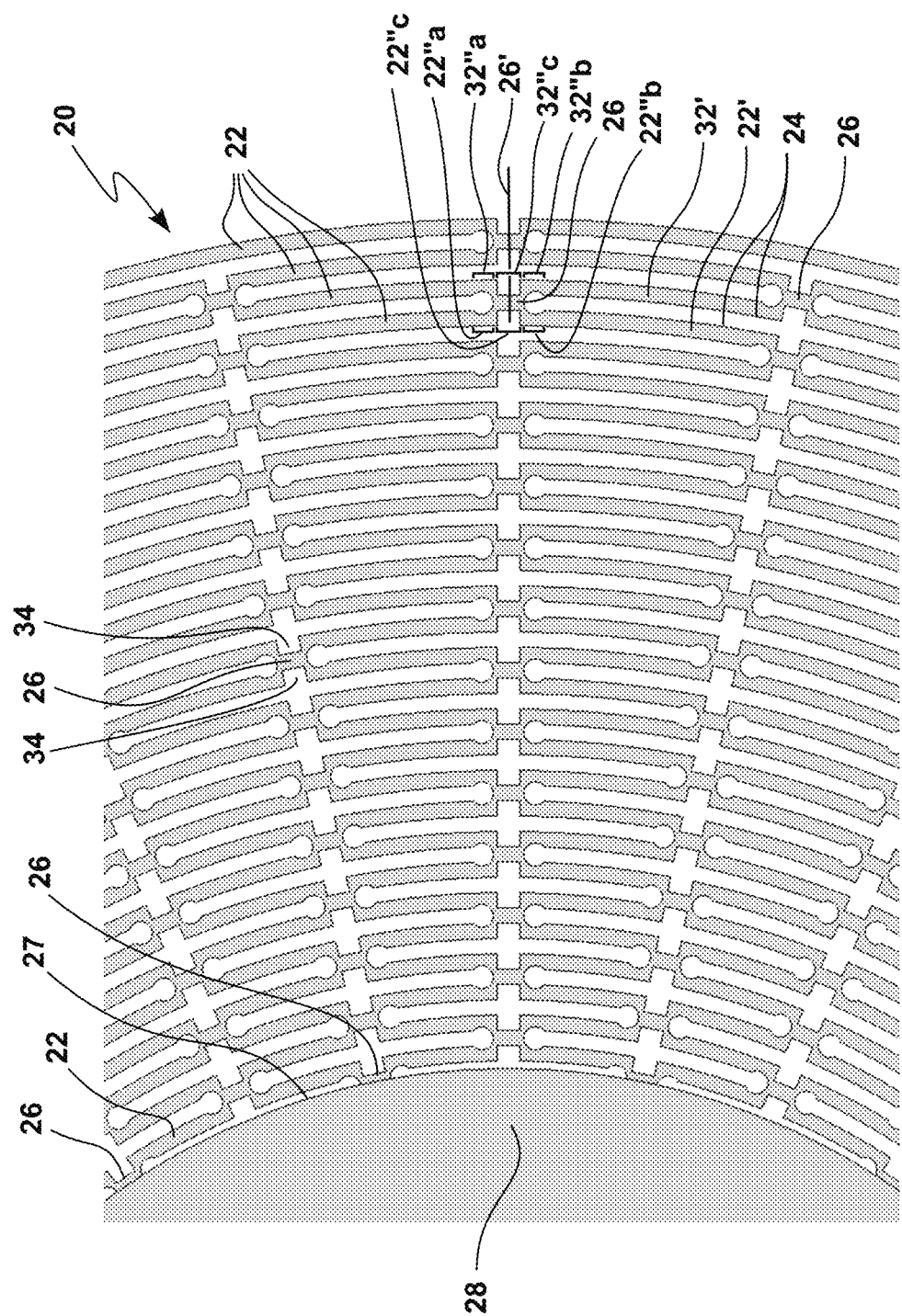
FIG. 2A is a top view of a fragment of a resonator according to an embodiment of this presentation.

FIG. 2A is a top view of a fragment of a resonator 20 according to an embodiment of this presentation; comprising a plurality of coaxial rings 22 wherein adjacent coaxial rings 22 have adjacent peripheries 24 and are attached together by a plurality of connection structures 26 regularly arranged along the adjacent peripheries 24. According to an embodiment of this presentation, rings 22 comprise each at least one first ring portion 22' with a first radial thickness (the radial thickness of most of the ring) and at least one second ring portion 22" (22"a, 22"b, 22"c), in a vicinity of each connection structure 26, which has a reduced radial thickness (a second radial thickness smaller than the first radial thickness), thus forming a hinged and slot-cut joint.

According to an embodiment of this presentation each ring 22 comprises as many first ring portions 22' as the ring 22 comprises connection structures 26 attached to both its inner and outer peripheries 24. According to an embodiment of this presentation, and as detailed hereafter, each ring 22 can comprise one to three ring portions of reduced radial thickness (22"a, 22"b, 22"c) in the vicinity of each connection structure 26 the ring is attached to.

According to an embodiment of this presentation, the rings 22 of resonator 20 are connected to an outer periphery 27 of a central support 28 having a rotational axis by connection structures 26 attached to an inner periphery 24 of an innermost ring 22.

According to an embodiment of this presentation, the coaxial rings 22, the connection structures 26 and central support 28 can all be formed by deep reactive ion etching of a single, plane, wafer, for example a plane wafer of silicon.

According to an embodiment of this presentation, the second ring portion (22"a) is angularly offset to a first side of a radial axis of the connection structure 26 it is closest to. According to an embodiment of this presentation, ring 22 comprises a third ring portion (22"b), having the same reduced radial thickness as the second ring portion 22"a, angularly offset to a second side of the radial axis of the first connection structure 26 the second ring portion 22"*a*, is closest to.

According to an embodiment of this presentation, when a first ring 22 of resonator 20 is connected to a second ring 22 (hereafter referenced 32 for clarity) of resonator 20 by the connection structure 26, second ring 32 has a fourth ring portion 32' having a third radial thickness (the radial thickness of most of ring 32) and has fifth (32"*a*) and sixth (32"*b*) ring portions having each a fourth radial thickness smaller than the third radial thickness; the fifth ring portion 32"*a* being radially aligned with the second ring portion 22"*a* and the sixth ring portion 32"*b* being radially aligned with the third ring portion 22"*b*. According to an embodiment of this presentation, all the rings 22 have a same (non-reduced) thickness along most of their length, and the above-mentioned first and third radial thicknesses are equal. The above-mentioned second and fourth radial thicknesses can then also be equal.

As illustrated in FIG. 2A, the peripheries of the two rings (22, 32) attached by connection structure 26, in said second (22"*a*), third (22"*b*), fifth (32"*a*) and sixth (32"*b*) ring portions, follow each, along a plane perpendicular to the axis of the rings (i.e. the plane of the paper in FIG. 2A), a portion of a circle shape having a diameter larger than the distance between the first (22') and fourth (32') ring portions. It is noted that according to other embodiments of this presentation and as illustrated hereafter for example in FIG. 7, the second (22"*a*), third (22"*b*), fifth (32"*a*) and sixth (32"*b*) ring portions, can alternatively follow each a portion of an ellipse, or of a rectangle shape or of a circle.

According to an embodiment of this presentation, an angular thickness of connection structure 26 can vary along its radial axis 26'. In the embodiment illustrated in FIG. 2A, the angular thickness of connection structure 26 varies along its radial axis such that the walls of connection structure 26 follow a same circular shape as the second (22"*a*), third (22"*b*), fifth (32"*a*) and sixth (32"*b*) ring portions, thus forming circular-hole shapes at each junction between two rings 22 and a connection structure 26.

According to an embodiment of this presentation, and as illustrated in FIG. 2A, the rings 22 (32) of resonator 20 can additionally, or alternatively, comprise another ring portion 22"*c* (32"*c*) of reduced radial thickness that is aligned with the radial axis 26' of the first connection structure 26. Such other ring portion of reduced radial thickness can be formed by a radial recess 34 developing from a periphery of the ring 22 distal from the first connection structure 26 toward the first connection structure 26. Radial recess 34 is shown in FIG. 2A as following portions of a rectangle. However, according to other embodiments of this presentation, radial recess 34 can also follow portions of a circle or of an ellipse.

As illustrated in FIG. 2A, the radial recess 34 can have a radial depth equal to or larger than the first (non-reduced) radial thickness of the rings 22. In such an embodiment, the reduced thickness of the ring in the radial axis of radial recess 34 is a null thickness; and the angular width of connection structure 26 must always be larger than the angular width of radial recess 34. According to other embodiments of this presentation, and as for example illustrated in FIG. 4 the radial recess 34 can also have a radial depth smaller than or equal to the first (non-reduced) radial thickness of the rings 22.

As illustrated in FIG. 2A, according to an embodiment of this presentation both the inner periphery and the outer periphery of a ring 22 of resonator 20 are attached to another portion of resonator 20 each by a number N of connections structures 26; and the connection structures 26 attached to the inner periphery of ring 22 are offset angularly with respect to the connection structures 26 attached to the inner periphery of ring 22 by an angle of $\pi/N$.

According to an embodiment of this presentation, the inner periphery and the outer periphery of the rings 22 of resonator 20 are not necessarily attached to another portion of resonator 20 by a same number. The number and position of the connection structures 26 attached to each periphery of each ring 22 of resonator 20 is nevertheless chosen such that resonator 20 shows a rotational symmetry.

A resonator according to an embodiment of this presentation, such as illustrated in FIG. 2A, achieves high thermal elastic damping limited and anchor limited quality factor (QTED and Qanchor), low acceleration sensitivity, high frequency tuning range and similar frequency than known Disc Resonator Gyroscopes (~10-15 kHz). According to embodiments of this presentation, central support 28 can be coupled to a solid cylinder to support resonator 20 on a substrate of a gyroscope using resonator 20. According to an embodiment of this presentation, resonator 20 can comprise 70 rings 22 (less are illustrated), with an outermost ring 22 having an 8 mm outer periphery diameter and a central support having a 3.8 mm anchor outer periphery diameter; each ring 22 generally having a radial width of 20 µm (away from the connection structures 26, in portion 22'); wherein the rings 22 are radially distant from each other of 10 µm away from the connection structures 26. According to an embodiment of this presentation, the portions of reduced radial width of rings 22 (portions 22"*a*, 22"*b*) on each side of connection structures 26 as well as the edges of connection structures 26 follow each portions of a circle shape having a diameter of 30 µm, the minimum angular width of the connection structures being of 30 µm; and the vertical thickness of rings 22 as well as connection structures 26 being of 350 µm. According to an embodiment, there can be a slot of full radial width between the central support and the inner periphery of the innermost ring, contrary to what is illustrated in FIGS. 2, 3 which show only a half radial width slot between the central support and the inner periphery of the innermost ring.

According to embodiments of this presentation, the reductions of radial width of connection structure 26 causes the rings of the resonator to be joined with more compliant connectors than in known disc resonators, thus making the rings of this presentation less stiff than the prior art rings with the same radial ring width. The inventors have noted that because prior art rings are stiffer, they deform less easily into an N2 elliptical mode shape than rings according to embodiments of this presentation, which eventually results in the rings of the known disc resonators to twist during resonance. Twisting of the rings generates hot and cold spots that is indicative of unwanted damping and a lowering of the QTED in the prior art disc resonator structures. The Inventors have noted that disc resonators according to embodiments of this presentation minimize hot and cold spots, because they have rings that are freer to deform.

According to embodiment of this presentation, varying the distance between the rings, the radial depth and angular width of radial thickness reductions of the rings allows optimizing the performance for each ring width, resulting in optimized geometry for different frequency operational range applications.

In other words, embodiments of this presentation relate to a resonant structure 20 comprising a plurality of concentric ring-like structures 22; each ring like structure 22 comprising a plurality of ring segments 22' of constant radial thickness; and a plurality of connection structures (22"a, 22"b, 22"c); each connection structure attaching together the plurality of ring segments 22' of two adjacent ring-like structures 22; wherein at least one portion (22"a, 22"b, 22"c) of each connection structure has a reduced radial thickness less than the sum of the radial thicknesses of the two adjacent ring-like structures 22 it connects.

According to embodiments of this presentation, each connection structure (22"a, 22"b, 22"c) comprises at least two (22"a, 22"b) of reduced radial thickness arranged symmetrically at equal angular distances from a central portion of the connection structure (22"a, 22"b, 22"c).

According to embodiments of this presentation, said at least one portion of reduced radial thickness is a central portion (22"c) of the connection structure (22"a, 22"b, 22"c).

Figure 2B:
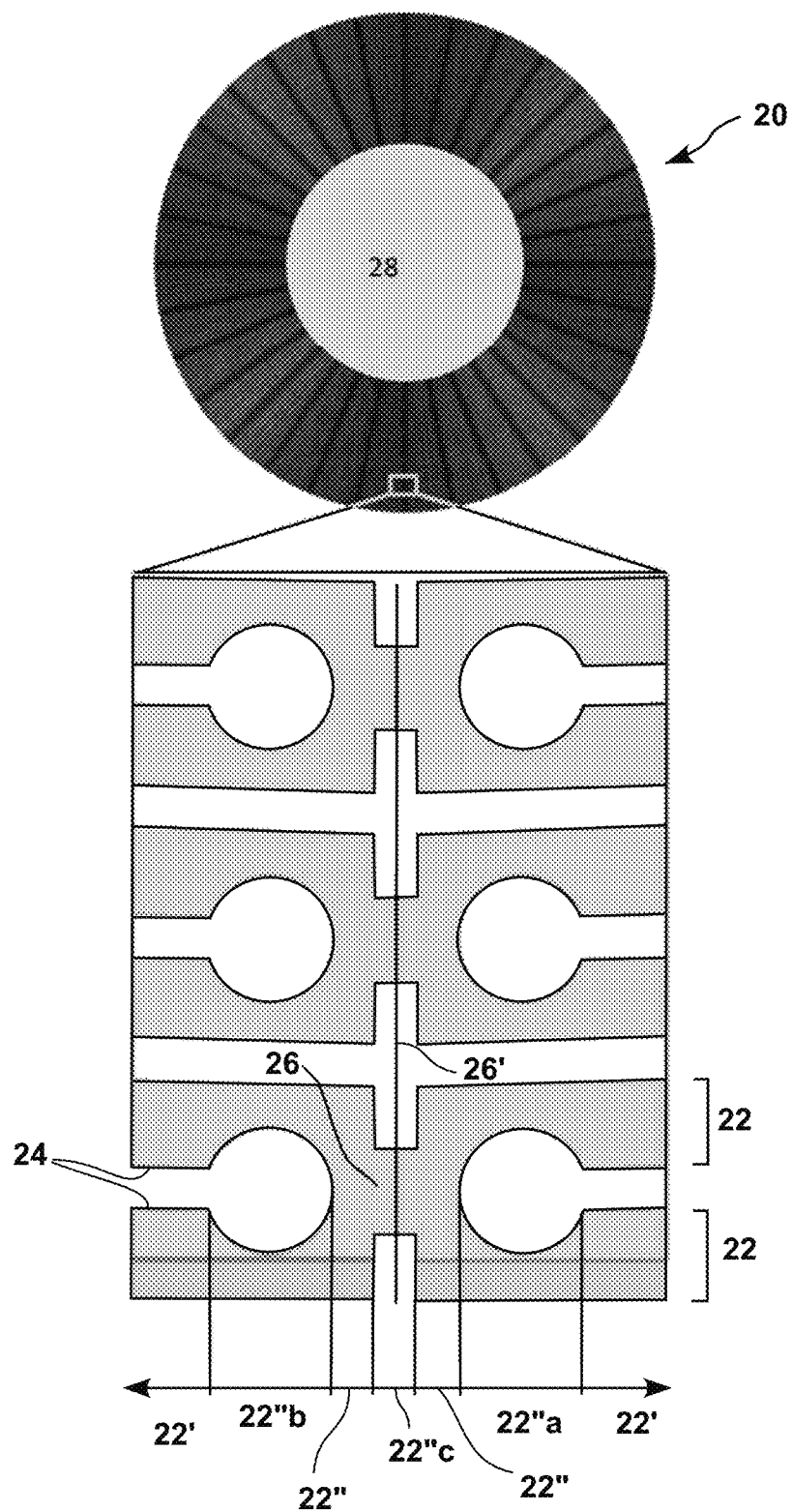
FIG. 2B is a top view of a resonator according to an embodiment of this presentation and of a detail thereof.
Figure 3:
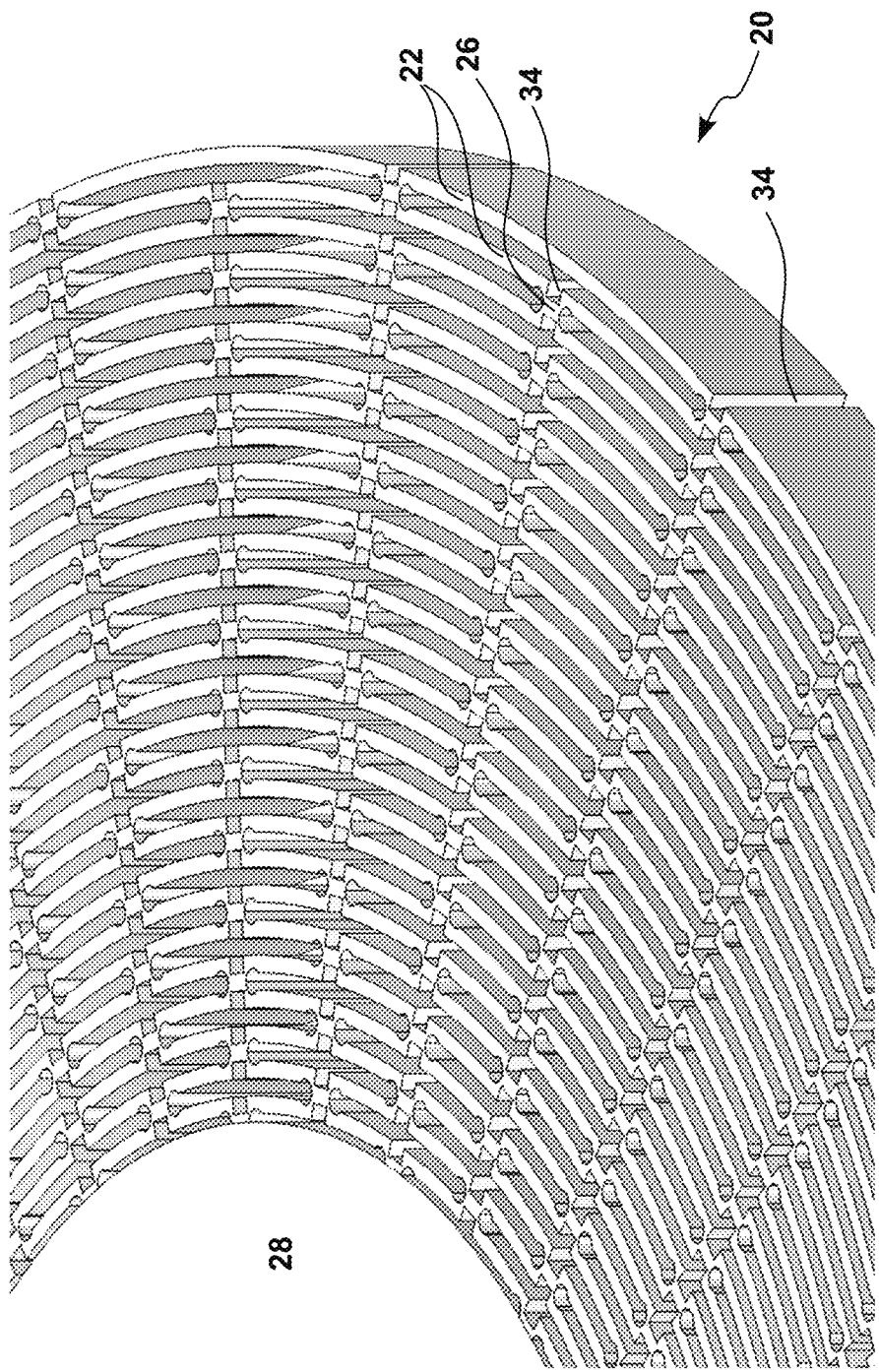
FIG. 3 is an elevation view of the resonator illustrated in FIG. 2A.

FIG. 2B is a top view of a resonator 20 according to an embodiment of this presentation; comprising a plurality of coaxial rings 22 wherein adjacent coaxial rings 22 have adjacent peripheries 24 and are attached together by a plurality of connection structures 26 regularly arranged along the adjacent peripheries 24. According to an embodiment of this presentation, rings 22 comprise each at least one first ring portion 22' with a first radial thickness (the radial thickness of most of the ring) and at least one second ring portion 22" (22"a, 22"b, 22"c), in a vicinity of each connection structure 26, which has a reduced radial thickness (a second radial thickness smaller than the first radial thickness), thus forming a hinged and slot-cut joint. According to an embodiment of this presentation, and as illustrated in FIG. 2B, two portions 22''' of ring 22 having the same thickness as portions 22' separate reduced thickness portion 22"c from reduced thickness portions 22"a and 22"b.

FIG. 3 is a perspective view of the portion of resonator 20 illustrated in FIG. 2A.

Figure 4:
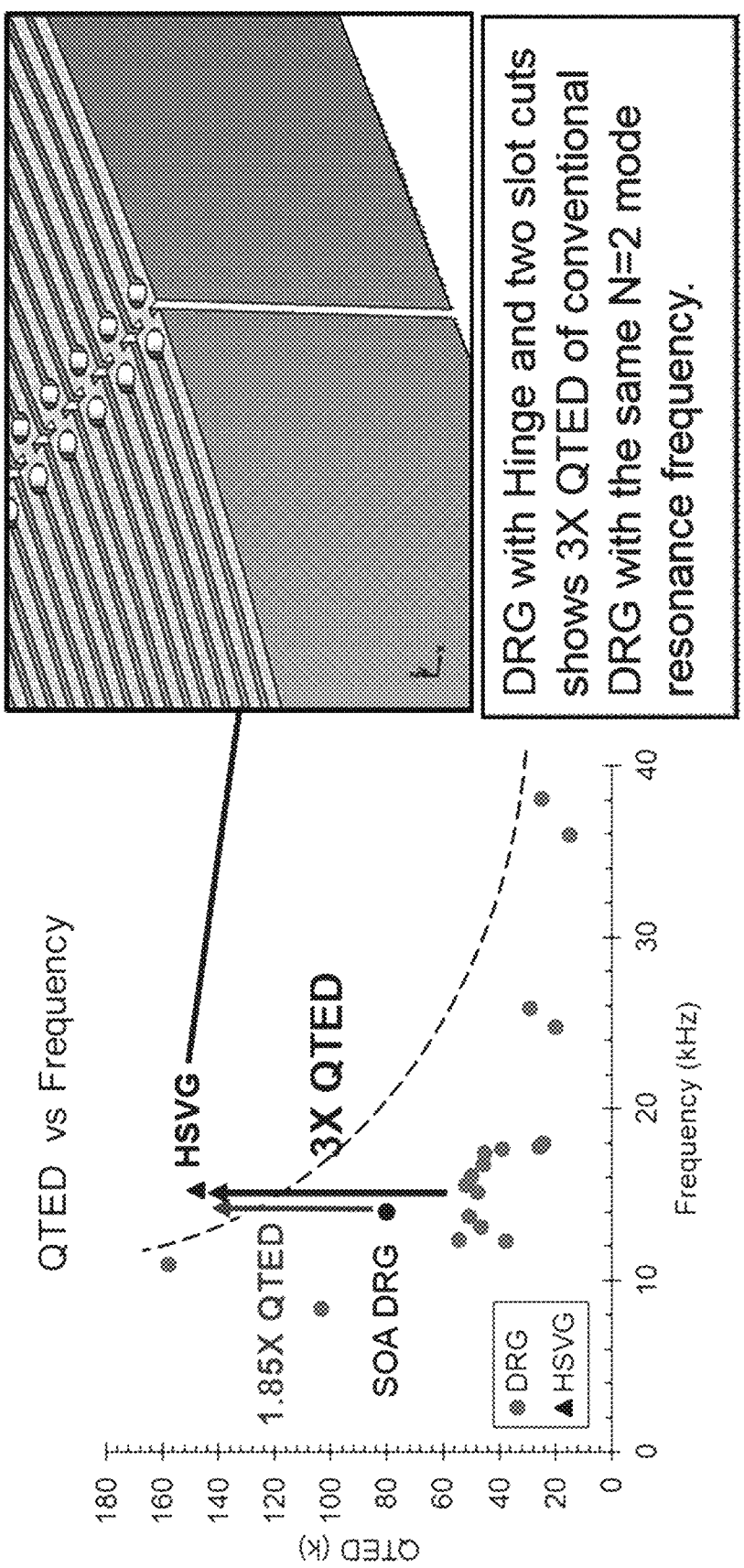
FIG. 4 shows simulated quality factor for a resonator as shown in FIG. 2A and measured one for known resonators.

FIG. 4 comprises a graph illustrating that a gyroscope using a resonator according to an embodiment of this presentation (a fragment of which is seen in perspective on the right of FIG. 4) can achieve a Thermo-Elastic Damping limited quality factor (QTED) of 148,000 (1.48E5) at a frequency of 15 kHz. The QTED data for the embodiment is simulated (circle and triangle). The SOA DRG (known resonator) measured Q (black circle) is 80,000. FIG. 4 shows that the QTED of a gyroscope using a resonator according to an embodiment of this presentation, having a N=2 mode resonance frequency, is 1.85 times larger than the QTED of a State Of the Art Disc Resonator Gyroscopes having a slightly lower N=2 mode resonance frequency (14 kHz), and 3.0 times larger than a conventional Disc Resonator Gyroscopes having a same N=2 mode resonance frequency. In FIG. 4, the blue triangle marks the QTED for the Gyroscope using a resonator according to this presentation; and circles represent possible Disc Resonator Gyroscopes designs with the black circle marking the known Disc Resonator Gyroscopes design. The dashed line in FIG. 4 shows the performance barrier of prior art DRGs.

The Inventors have shown that, compared with the known Disc Resonator Gyroscopes, gyroscopes using a resonator according to embodiments of this presentation can operate at a frequency greater than 15 kHz without compromising other performance aspects, including vibration insensitivity and electrical frequency tuning range.

Figure 5:
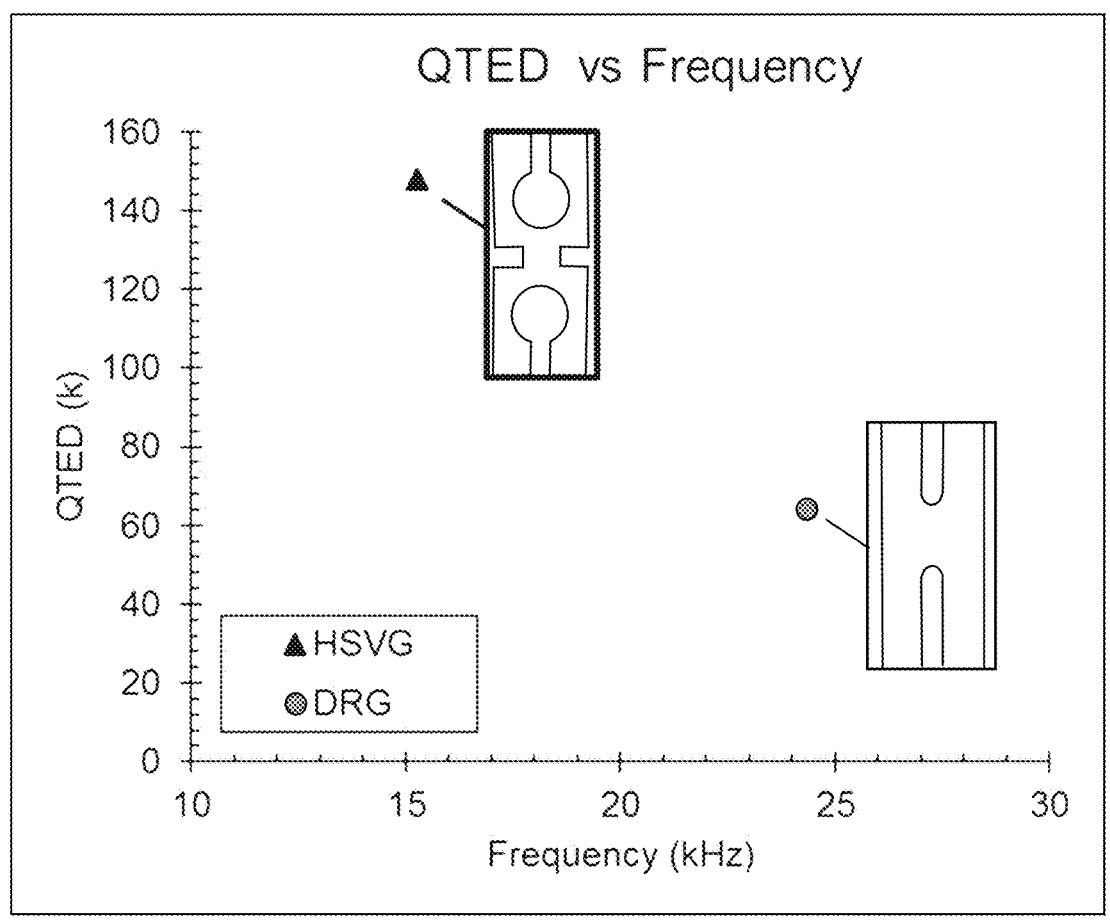
FIG. 5 shows simulated quality factor for a resonator as shown in FIG. 2A and for a known resonator with the same ring width.

FIG. 5 illustrates the QTED of two gyroscopes: one using a known resonator having rings connected as illustrated in FIG. 5 (circle mark) and one using a resonator according to an embodiment of this presentation, having a same ring radial width (and axial height) but having reduced radial widths as disclosed in relation with FIG. 2A and illustrated in FIG. 5 (triangle mark). The HSVG and DRG resonators in this figures have the same ring (label 22 in FIG. 2A) width. One can see that without the hinge and slot cut (ring portions of reduced radial thickness), the conventional DRG has higher resonant frequency and lower QTED.

A resonator according to an embodiment of this presentation has a lower N=2 mode resonance frequency than the known resonator with a same ring radial width (because the connection between two rings is more compliant in a resonator according to embodiments of this presentation), whereas the vibratory resonance frequency of a resonator according to embodiments of this presentation is preferably above the application vibration spectrum (<10 kHz; the vibration spectrum frequency range that the gyro will see during operation), as shown in FIG. 5. FIG. 5 shows that the QTED of a gyroscope using a resonator according to embodiments of this presentation can be 2.3 times the QTED of a conventional Disc Resonator Gyroscopes with same ring width.

Figure 6A:
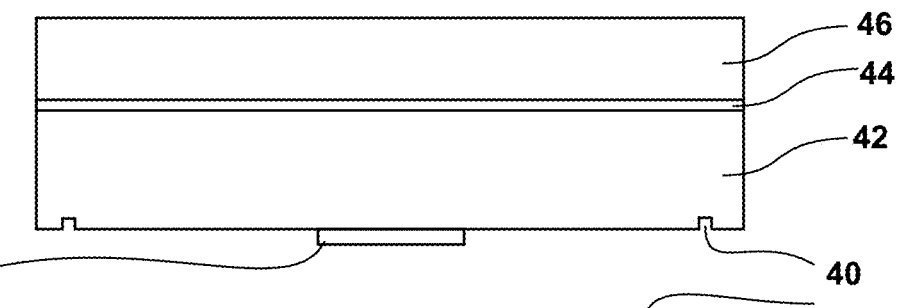
FIGS. 6A to 6D illustrate a method of fabrication of a resonator according to embodiments of this presentation.

FIGS. 6A to 6D illustrate a fabrication process of a gyroscope comprising a resonator according to embodiments of this presentation. As illustrated in FIG. 6A, a backside alignment target 40 is formed by etching a substrate 42, for example a Si (silicon) substrate, attached by a partly sacrificial layer 44 on the backside of a another Si wafer 46, thus forming a SOI wafer 47; followed by a patterning of a backside metal layer 48 (which for example allows a subsequent die attachment to an Leadless Chip Carrier package).

Figure 6B:
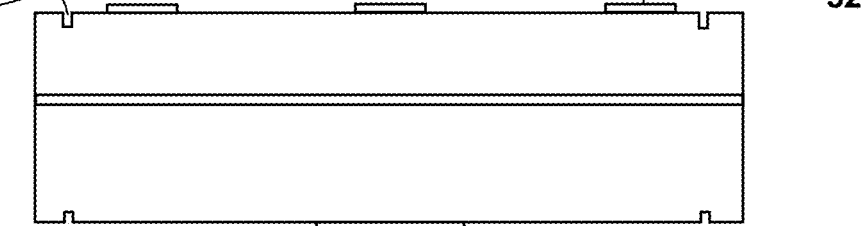

As illustrated in FIG. 6B, a front side alignment target 50 is then etched in a substrate (here Si) 46 on the front side of SOI wafer 47, following by a patterning of a front side metal layer to form electrical contacts 52.

Figure 6C:
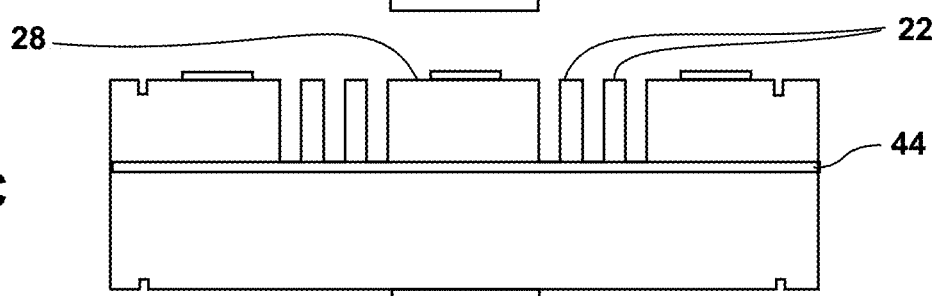
Figure 6D:
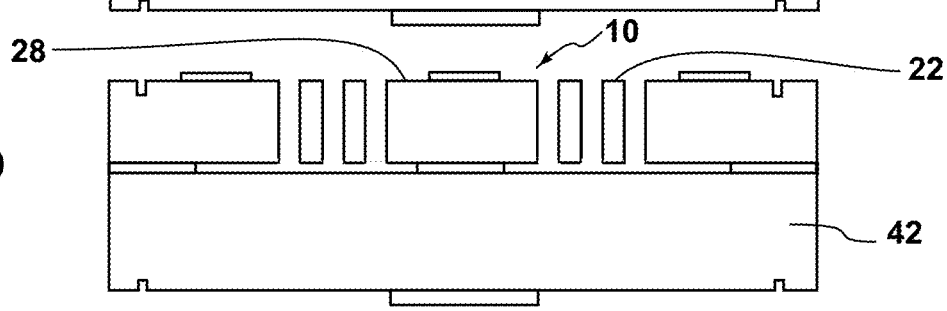

As illustrated in FIG. 6C the rings (two illustrated) and central support 28 of the resonator structure are formed, for example by Deep Reactive-ion Etching (DRIE) of the substrate 46 (here Si), exposing portions of layer 44, the buried oxide, for a hydrofluoric acid (HF) undercut to release the structure in step four, as shown in FIG. 6D.

As illustrated in FIG. 6D the resonator is completed by etching away (for example using hydrofluoric acid (HF)) the portions of layer 44 that maintain the rings 22 (while keeping a portion of layer 44 below central support 28 to keep the resonator attached to substrate 42).

Figures 7A, 7B, 7C:
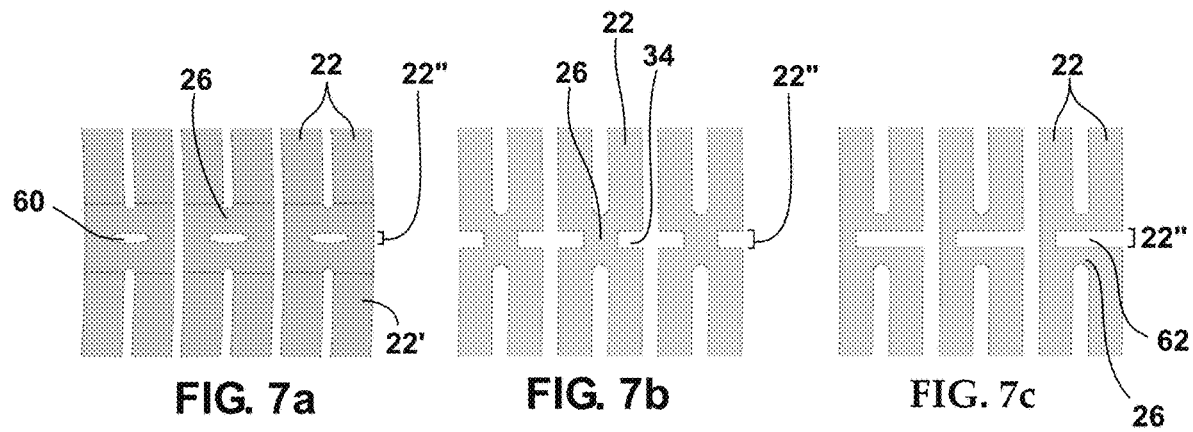
FIGS. 7a to 7i illustrate various embodiments of connection structures of resonators according to this presentation.

FIG. 7a illustrates an embodiment of the connection structures 26 of the rings 22 of a resonator according to an embodiment of this presentation, wherein the reduced radial thickness portion 22" of a ring 22 is formed by a radial recess 60 that develops radially from a center of the connection structure 26 that is attached to a periphery of the ring 22, toward the other periphery of the ring 22. In the embodiment illustrated, radial recess 60 forms an elliptic cut out in the connection structure between the rings.

FIG. 7b illustrates an embodiment of the connection structures 26 of the rings 22 of a resonator according to an embodiment of this presentation, wherein the reduced radial thickness portion 22" of a ring 22 is formed by a radial recess 34 that develops radially from a periphery of the ring 22 distal from the connection structure 26 that is attached to it, toward the connection structure 26.

FIG. 7c illustrates an embodiment of the connection structures 26 of the rings 22 of a resonator according to an embodiment of this presentation, wherein, for two rings 22 attached by a connection structure 26, at least a first ring 22 comprises a reduced radial thickness portion 22" formed by a radial recess 62 that develops radially from a periphery of the first ring 22 distal from the connection structure 26, into connection structure 26 toward the second ring 22 attached to connection structure 26. As illustrated in FIG. 7c, radial recess 62 may have a radial length larger than the radial thickness of the first ring 22 (in which case its portion of reduced thickness 22" has a null thickness) and may have a radial length larger than the sum of the radial thickness of the first ring 22 and of the connection structure 26 (in which case also the second ring 22 has a portion of reduced thickness 22"). As illustrated in FIG. 7c, in a resonator according to an embodiment of this presentation, the radial recesses formed in consecutive pairs of rings 22 can all develop in a same radial direction (from a periphery of a ring 22 on the right of the figure in FIG. 7c).

Figures 7D, 7E:
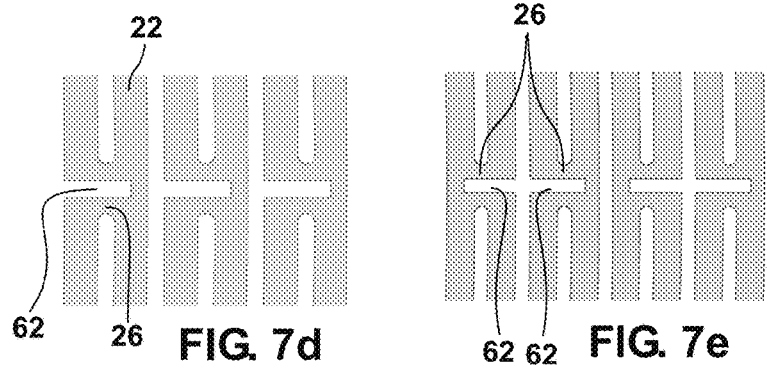

FIG. 7d is essentially identical to FIG. 7c, but for having radial recesses 62 that develop in a direction opposite the direction in FIG. 7c.

FIG. 7e is essentially identical to FIG. 7c or 7d, except that for each couple of pairs of rings 22 attached by couple of connection structures 26, the resonator comprises a couple of radial recesses 62 that develop in opposite directions.

Figures 7F, 7G:
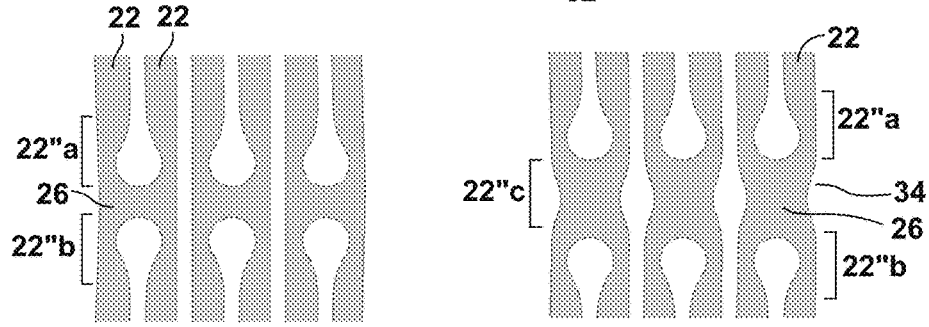

FIG. 7f illustrates a portion of a single pair of rings 22 of a resonator according to embodiments of this disclosure, attached by a connection structure 26, where each ring 22 comprises two ring portions 22"a, 22"b of reduced radial thickness, on each side of a radial axis of connection structure 26, that follow each, along a plane perpendicular the axis of the rings (i.e. the plane of the paper in FIG. 2A), a portion of an ellipsoid shape. As illustrated in FIG. 7f, the angular width of connection structure 26 varies radially, such that the periphery of the ring portions 22"a or 22"b of reduced radial thickness of the rings attached by connections structure 26, as well as the edge of connections structure 26 that joins these ring portions, follow a teardrop-shaped curve (whereby the peripheries of the rings 22 and their junction to connection structures 26 comprise no sharp angle).

FIG. 7g illustrates a portion of a single pair of rings 22 of a resonator according to embodiments of this disclosure, attached by a connection structure 26, similar to the embodiment illustrated in FIG. 7f but where each ring 22 comprises three ring portions 22"a, 22"b and 22"c of reduced radial thickness. The two first ring portions 22"a and 22"b on each side of a radial axis of connection structure 26 are identical to those disclosed in FIG. 7f. In addition, the third ring portion 22"c of reduced radial thickness is formed by a radial recess 34 developing from the periphery of ring 22 that is distal from connection structure 26, toward connection structure 26. As illustrated in FIG. 7g, radial recess follows a trigonometric function such that the junction between the ring periphery and recess comprises no sharp angle.

Figures 7H, 7I:
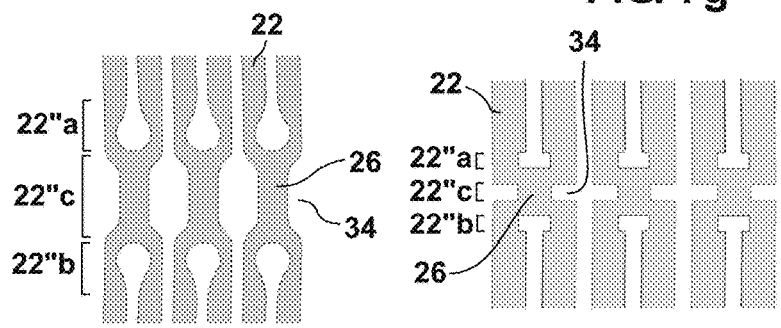

FIG. 7h illustrates an embodiment of this presentation that differs from the embodiment of FIG. 7g by having a connection structure 26 and a recess 34 angularly wider than in FIG. 7g, where the deepest point of recess 34 is essentially flat (normal to a radial axis of connection structure 26).

FIG. 7i illustrates a portion of rings 22 of a resonator according to embodiments of this disclosure, attached by a connection structure 26, where each ring 22 comprises three ring portions 22"a, 22"b and 22"c of reduced radial thickness, arranged symmetrically with respect to a radial axis of connection structure 26, identical to for example the embodiment illustrated in FIG. 2A, except that the angular width of connection structure 26 does not vary radially, such that the periphery of the ring portions 22"a or 22"b of reduced radial thickness of the rings attached by connections structure 26, as well as the edge of connections structure 26 that joins these ring portions, follow a rectangular-shaped curve.

FIG. 8A is a top view of a portion of a Gyroscope using a resonator 20 according to embodiments of this presentation, having concentric rings 22 attached together by connection structures 26 arranged regularly on the peripheries of the rings. FIG. 8B shows an enlarged view of a portion of the gyroscope of FIG. 8A with peripheral electrodes 80 (two shown in FIG. 8B) for driving the resonator or sensing the resonator's motion; as well as a peripheral electrode 82, which can be a ground resonator. FIGS. 8A to 8E are "negative" figures in which the darker areas such as between the rings represent voids or spaces between the white, material, areas.

As illustrated in FIGS. 8C and 8D, which represent enlarged views of the enlarged portion shown in FIG. 8B, the connection structures 26 attached to each periphery of a same ring 22 are radially offset. FIG. 8C shows that the inner periphery of the outward-most ring 22 of resonator 20 is attached to the outward periphery of the second outward-most ring 22 of resonator 20 by a first connection structure 26.

As illustrated in FIGS. 8C, the inner periphery of the second outward-most ring 22 of resonator 20 is not attached to the outer periphery of the third outward-most ring 22 by a second connection structure 26 that would be radially aligned with the first connection structure 26. As illustrated in FIGS. 8D, the inner periphery of the second outward-most ring 22 of resonator 20 is attached to the outer periphery of the third outward-most ring 22 by a second connection structure 26 that is angularly offset from the first connection structure 26 (by an angle of π/N where each ring is connected to the next ring by N connection structures 26).

As illustrated in FIG. 8E, the innermost ring 22 of resonator 20 can be connected to central support 28 by a connection structure 26 of same radial length as the connection structures 26 connecting the rigs 22 together.

Alternatively, and as illustrated in FIG. 2A, the innermost ring 22 of resonator 20 can be connected to central support 28 by a connection structure of reduced radial length with respect to the radial length of the connection structures 26 connecting the rings 22 together. As illustrated in FIG. 8, the outer periphery of the central support 28 can comprise regions of reduced radial length, arranged to match the inward-facing portions of reduced radial width of the innermost ring 22.

Having now described the invention in accordance with the requirements of the patent statutes, those skilled in this art will understand how to make changes and modifications to the present invention to meet their specific requirements or conditions. Such changes and modifications may be made without departing from the scope and spirit of the invention as disclosed herein.

The foregoing Detailed Description of exemplary and preferred embodiments is presented for purposes of illustration and disclosure in accordance with the requirements of the law. It is not intended to be exhaustive nor to limit the invention to the precise form(s) described, but only to enable others skilled in the art to understand how the invention may be suited for a particular use or implementation. The possibility of modifications and variations will be apparent to practitioners skilled in the art.

No limitation is intended by the description of exemplary embodiments which may have included tolerances, feature dimensions, specific operating conditions, engineering specifications, or the like, and which may vary between implementations or with changes to the state of the art, and no limitation should be implied therefrom. Applicant has made this disclosure with respect to the current state of the art, but also contemplates advancements and that adaptations in the future may take into consideration of those advancements, namely in accordance with the then current state of the art.

The invention claimed is:

1. A resonant structure comprising at least two coaxial rings, wherein:
   adjacent coaxial rings have adjacent peripheries and are attached together by a plurality of connection structures regularly arranged along said adjacent peripheries; and
   a first ring has a first ring portion with a first radial thickness and a second ring portion, in a vicinity of a first connection structure, with a second radial thickness smaller than said first radial thickness;
   wherein said second ring portion is formed by a first radial recess developing from a periphery of said first ring distal from said first connection structure toward said first connection structure.

2. The resonant structure of claim 1, where the at least two coaxial rings and the plurality of connection structures are formed out of a single plane substrate.

3. The resonant structure of claim 1, wherein an angular thickness of said first connection structure varies along a radial axis of said first connection structure.

4. The resonant structure of claim 1, wherein said first ring portion is aligned with a radial axis of said first connection structure.

5. The resonant structure of claim 1, wherein the periphery of said first ring, in said second ring portion, follow, along a plane perpendicular to the axis of the rings, portions of a shape selected among:
   a circle;
   an ellipse; and
   a rectangle.

6. The resonant structure of claim 1, comprising:
   a second ring concentrically attached to said first ring by said first connection structure; and
   third and fourth concentric rings attached together by a second connection structure radially aligned with said first connection structure; wherein the third ring has a third ring portion having a third radial thickness and has a fourth ring portion having a fourth radial thickness smaller than said third radial thickness; the fourth ring portion being radially aligned with the second ring portion;
   said fourth ring portion being formed by a second radial recess developing from a periphery of said third ring distal from said second connection structure toward said second connection structure.

7. The resonant structure of claim 6, wherein one of the first and second rings is attached to one of the third and fourth rings by a plurality of regularly arranged connection structures angularly offset from the connection structures attaching the first and second rings.

8. The resonant structure of claim 6, wherein a same number N of connection structures attach each ring to a neighboring ring; and wherein connection structures attached to the inner and outer periphery of each ring are angularly offset by $\pi/N$ from each other.

9. The resonant structure of claim 6, wherein the first and second radial recesses develop in a same radial direction.

10. The resonant structure of claim 6, wherein the first and second radial recesses develop in opposite radial directions.

11. The resonant structure of claim 1, comprising:
    a second ring concentrically attached to said first ring by said first connection structure; wherein the second ring has a third ring portion having a third radial thickness and has a fourth ring portion having a fourth radial thickness smaller than said third radial thickness; the fourth ring portion being radially aligned with the second ring portion;
    said fourth ring portion being formed by a second radial recess developing from a periphery of said second ring distal from said first connection structure toward said first connection structure.

12. The resonant structure of claim 1, wherein said first radial recess develops into said first connection structure.

13. The resonant structure of claim 12, wherein said first radial recess develops into a second ring concentrically attached to said first ring by said first connection structure.

14. The resonant structure of claim 1, wherein an angular thickness of said first connection structure varies along a radial axis of said first connection structure.

15. The of claim1, wherein said second ring portion is angularly offset to a first side of a radial axis of said first connection structure.

16. A resonant structure comprising at least two coaxial rings, wherein:
    adjacent coaxial rings have adjacent peripheries and are attached together by a plurality of connection structures regularly arranged along said adjacent peripheries; and
    a first ring has a first ring portion with a first radial thickness and a second ring portion, in a vicinity of a first connection structure, with a second radial thickness smaller than said first radial thickness; and
    wherein said second radial thickness is formed by a first radial recess developing from a center of said first connection structure toward a periphery of the first ring distal from said first connection structure.

17. A resonant structure comprising a plurality of concentric ring-like structures; each ring like structure comprising a plurality of ring segments of constant radial thickness; and
    a plurality of connection structures; each connection structure attaching together the plurality of ring segments of two adjacent ring-like structures; wherein
    at least one portion of each connection structure has a reduced radial thickness less than the sum of the radial thicknesses of the two adjacent ring-like structures it connects;
    wherein said at least one portion of reduced radial thickness is a central portion of the connection structure.

18. The resonant structure of claim 17, wherein each connection structure comprises at least two portions of reduced radial thickness arranged symmetrically at equal angular distances from a central portion of the connection structure.

* * * * *